United States Patent [19]
Yoder

[11] Patent Number: 4,768,167
[45] Date of Patent: Aug. 30, 1988

[54] HIGH SPEED CMOS LATCH WITH ALTERNATE DATA STORAGE AND TEST FUNCTIONS

[75] Inventor: Joseph W. Yoder, Fairfax, Va.

[73] Assignee: International Business Machines Corporation, Armonk, N.Y.

[21] Appl. No.: 913,434

[22] Filed: Sep. 30, 1986

[51] Int. Cl.[4] .................. G11C 11/00; G11C 7/00; G11C 29/00; G11C 19/00

[52] U.S. Cl. ............................ 365/156; 365/154; 365/201; 365/189; 377/79; 371/13

[58] Field of Search ............... 365/181, 189, 154, 201, 365/156, 78, 203, 204, 190, 240; 371/21, 24; 377/77, 78, 79, 80; 307/279, 272 A

[56] References Cited

U.S. PATENT DOCUMENTS

| | | | |
|---|---|---|---|
| 4,149,268 | 4/1979 | Waters | 365/156 |
| 4,150,441 | 4/1979 | Ando | 365/203 |
| 4,247,921 | 1/1981 | Itoh et al. | 365/189 |
| 4,250,406 | 2/1981 | Alaspa | 307/205 X |
| 4,253,162 | 2/1981 | Hollingsworth | 365/156 |
| 4,281,260 | 7/1981 | Moegen et al. | 307/279 |
| 4,342,103 | 7/1982 | Higuchi et al. | 365/201 |
| 4,356,411 | 10/1982 | Suzuki et al. | 307/279 |
| 4,418,402 | 11/1983 | Heagerty et al. | 365/156 X |
| 4,601,017 | 7/1986 | Moclizuki et al. | 365/203 |
| 4,669,061 | 5/1987 | Blavsar | 365/154 X |
| 4,684,826 | 8/1987 | France et al. | 307/272 A X |
| 4,685,086 | 8/1987 | Tran | 365/201 |

FOREIGN PATENT DOCUMENTS

| | | | |
|---|---|---|---|
| 58-199491 | 11/1983 | Japan | 365/156 |
| 59-210586 | 11/1984 | Japan | 307/279 |

OTHER PUBLICATIONS

IBM Techn. Discl. Bull., vol. 13, No. 2, Jul. 1970, pp. 493–494, "Complementary Shift Register" by Hastings.
IBM Technical Disclosure Bulletin, vol. 12, No. 12, May 1970, pp. 2138–2139, "Static Field Effect Trans. Shift Register" by Gaensslen et al.
IBM Tech. Discl. Bull., vol. 13, No. 5, Oct. 1970, pp. 1349–1350, "Noncomplementary Static Shift Register" by Gaensslen et al.
IBM Tech. Discl. Bull., vol. 26, No. 7B, Dec. 1983, pp. 3936–3938, "Dynamic L1/Static L2 Merged CMOS Register Circuits" by Thome.

Primary Examiner—Stuart N. Hecker
Assistant Examiner—Alfonso Garcia
Attorney, Agent, or Firm—John E. Hoel; H. St. Julian

[57] ABSTRACT

A CMOS flip-flop circuit is disclosed which enables a single side pull-down operation for inputting test signals during a test mode and alternately a dual side push-pull operation for inputting data signals during the normal use of the circuit. A pair of inverter circuits selectively feed complementary data signals to opposite sides of a bistable circuit so that the circuit operates in the push-pull manner thereby decreasing the switching time of the flip-flop. A pair of transmission gates, which are coupled to outputs of the inverter circuits, electrically isolate any noise appearing at a data input from the bistable circuit. During a test mode of the flip-flop, a test signal is fed into one side of the bistable circuit and facilitates a single side pull-down operation of the flip-flop. Two such flip-flop circuits are concatenated in a push-pull cascaded connection to provide a shift register latch.

11 Claims, 3 Drawing Sheets

HIGH SPEED CMOS LATCH WITH ALTERNATE DATA STORAGE AND TEST FUNCTIONS

DESCRIPTION

BACKGROUND OF THE INVENTION

1. Field of the Invention

This invention relates broadly to field effect transistor storage circuits, and more particularly, relates to latch circuits.

2. Background Information

Latch circuits are well known in the art. A typical latch circuit includes a pair of cross-coupled field effect transistor (FET) devices which forms a bistable latch. Generally, the FET devices were N-type devices. In operating the latch, one node which is associated with a first side of the latch was pulled to a low-level potential by a data signal. This low-level potential switches an inverter which associated with a second side of the latch. The potential appearing on a node associated with the second side of the latch increases to a high-level and is fed back to an inverter associated with the first side of the latch clamping the first side to the low-level potential. Thus, the second side of the latch did not react to the data signal until the potential associated with the first side thereof was reduced to the low-level near ground potential. Therefore, a delay was inherent in the latch design wherein the second side had to wait for the first side to switch before the data signal would be stored. This latch design resulted in a slow speed of operation and the N-type devices occupied valuable space on an integrated circuit.

OBJECTS OF THE INVENTION

Therefore it is an object of the invention to provide a latch circuit which is operable at a high speed.

It is another object of the invention to provide a latch circuit which has a single-side mode of operation for inputting test data.

It is still another object of the invention to provide an improved latch circuit which includes a first flip-flop circuit which is isolated from a second flip-flop circuit.

SUMMARY OF THE INVENTION

In accordance with these objects, features and advantages of the invention are accomplished by a high speed flip-flop circuit disclosed herein. The flip-flop circuit includes a bistable circuit and a first means which in response to a data input signal, generates a complementary data input signal. A second means in response to the first means generates a true data input signal. Transmitting means, which are coupled between the first and the second generating means and first and second nodes the bistable circuit, respectively, selectively transmit the true and the complementary data signals to the bistable circuit for storage therein during a data mode of the flip-flop circuit. Testing means, which are coupled to the first and the second nodes, facilitate the storage of test signals in the bistable circuit during a test mode of the flip-flop circuit. The flip-flop circuit then operates as a dual side push-pull circuit during the data mode and as a single side pull-down circuit during the test mode of the circuit. Two such flip-flop circuits are concatenated in a push-pull cascaded connection to provide a shift register latch.

BRIEF DESCRIPTION OF THE DRAWINGS

The foregoing and other advantages of the invention will be more fully understood with reference to the description of the best mode and the drawings wherein.

DESCRIPTION OF THE BEST MODE FOR CARRYING OUT THE INVENTION

Figure 1:
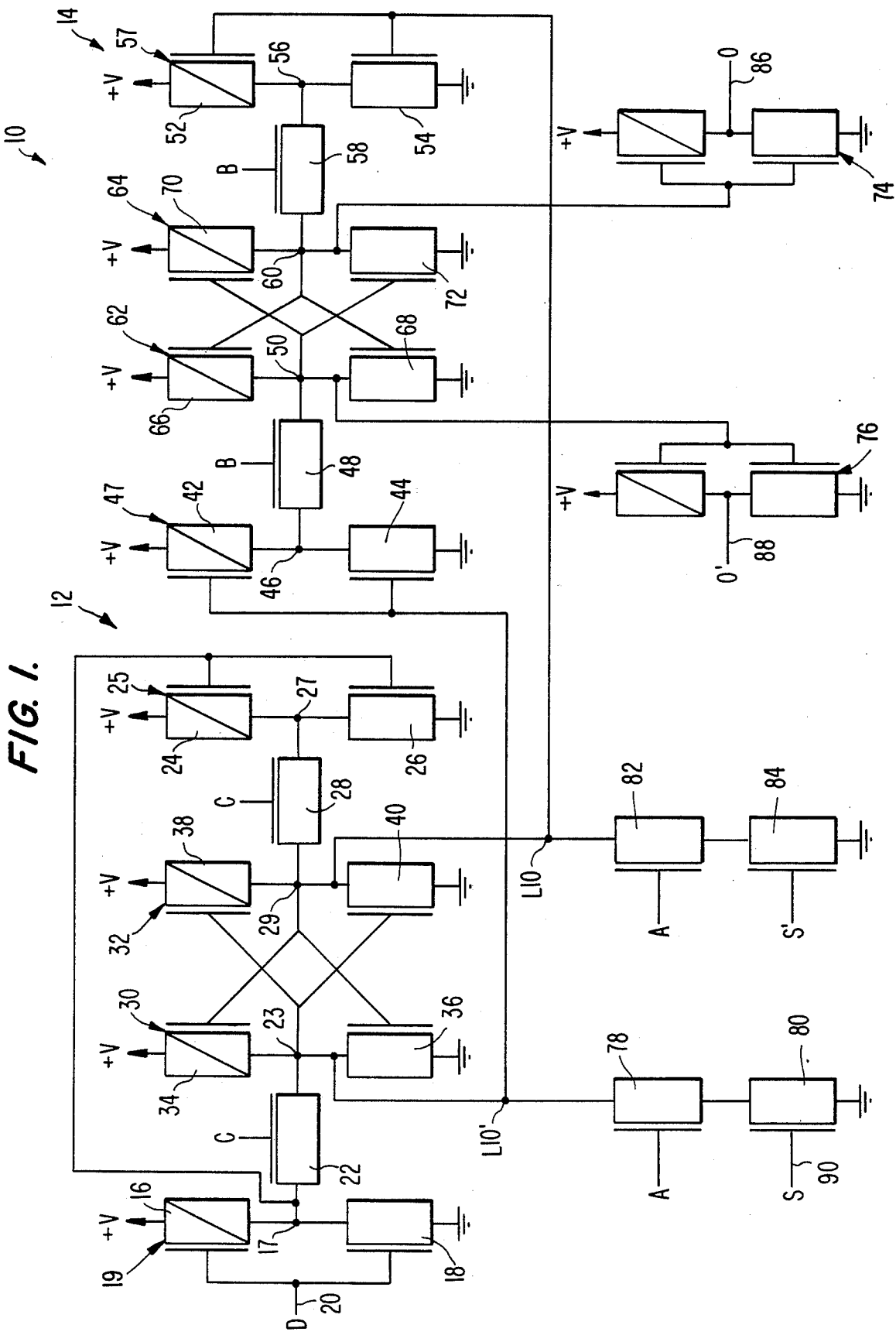
FIG. 1 shows a schematic diagram of a complementary metal oxide semiconductor latch circuit in accordance with the principles of the invention.

Referring to FIG. 1, there is shown a dual-input CMOS shift register latch circuit 10 which facilitates a single side pull-down operation for inputting test bits during a test mode and alternately, a dual side push-pull operation for data operations during normal use of the latch circuit. The latch circuit 10 includes two flip-flops circuits 12 and 14 which are concatenated in order to provide the shift register operation of the latch.

Flip-flop circuit 12 includes a first pair of field effect transistor (FET) devices 16 and 18 having their gate inputs coupled to a data input 20. FET device 16 is a P-channel device having its source/drain path connected between a positive reference potential and a first node 17. FET device 18 is a N-channel device having its source/drain connected between the first node 17 and ground potential. FET devices 16 and 18 are coupled together to form a first inverter circuit 19. A first transmission gate 22, which is a N-channel FET device, has its source/drain path coupled between the first node 17 and a second node 23. Flip-flop circuit 12 further includes a second pair of FET devices 24 and 26 having their gate inputs coupled to the first node 17. FET device 24 is a P-channel device having its source/drain path connected between the positive reference potential and a third node 27. FET device 26 is a N-channel device having its source/drain path connected between the third node 27 and ground potential. FET devices 24 and 26 are coupled together to form a second inverter circuit 25. A second transmission gate 28, which is a N-channel device, has its source/drain path connected between the third node 27 and a fourth node 29.

The flip-flop circuit 12 further includes a bistable circuit having two cross-coupled inverter circuits 30 and 32. Inverter circuit 30 includes a P-channel FET device 34 and a N-channel FET device 36. Inverter 32 includes a P-channel FET device 38 and a N-channel FET device 40. FET devices 34 and 38 have their respective source/drain path connected between the positive reference potential and the second node 23 and the fourth 29, respectively. FET devices 36 and 40 have their respective source/drain path connected between ground potential and the second node 23 and the fourth node 29, respectively. The gate inputs of FET devices 38 and 40 are coupled to the second node 23 which serves as an output for the flip-flop circuit 12. In a similar manner, the gate inputs of FET devices 34 and 36 are coupled to the fourth node 29 which serves as another output of the flip-flop circuit 12.

Flip-flop circuit 14 includes a first pair of field effect transistor (FET) devices 42 and 44 having their gate inputs coupled to the second node 23. FET device 42 is a P-channel device having its source/drain path connected between a positive reference potential and a fifth node 46. FET device 44 is a N-channel device having its source/drain connected between the fifth node 46 and ground potential. FET devices 42 and 44 are coupled together to form a third inverter circuit 47. A first transmission gate 48, which is a N-channel FET device, has its source/drain path coupled between the fifth node 46 and a sixth node 50. Flip-flop circuit 14 further includes a second pair of FET devices 52 and 54 having their gate inputs coupled to the fourth node 29. FET device 52 is a P-channel device having its source/drain path connected between the positive reference potential and a seventh node 56. FET device 54 is a N-channel device having its source/drain path connected between the seventh node 56 and ground potential. FET devices 52 and 54 are coupled together to form a fourth inverter circuit 57. A second transmission gate 58, which is a N-channel device, has its source/drain path connected between the seventh node 56 and a eighth node 60.

The flip-flop circuit 14 further includes a bistable circuit having two cross-coupled inverter circuits 62 and 64. Inverter circuit 62 includes a P-channel FET device 66 and a N-channel FET device 68. Inverter 64 includes a P-channel FET device 70 and a N-channel FET device 72. FET devices 66 and 70 have their respective source/drain path connected between the positive reference potential and the sixth node 50 and the eighth node 60, respectively. FET devices 68 and 72 have their respective source/drain path connected between ground potential and the sixth node 50 and the eighth node 60, respectively. The gate inputs of FET devices 70 and 72 are coupled to the sixth node 50 which serves as an output for the flip-flop circuit 14. In a similar manner, the gate inputs of FET devices 66 and 68 are coupled to the eighth node 60 which serves as another output of the flip-flop circuit 14. Output buffers 74 and 76, which are coupled to the eight node 60 and the sixth node 50, respectively, facilitate the generation of an output signal and its complement, respectively.

The latch circuit 10 also includes four N-channel FET devices 78, 80, 82 and 84 which facilitate the input of test signals into the latch circuit during the test mode of operation. FET devices 78 and 80, having their source/drain paths coupled between the second node 23 and ground potential, facilitate the storage of a binary zero by the filp-flop circuit 12. FET devices 82 and 84, having their source/drain paths coupled between the fourth node 29 and ground potential, facilitate the storage of a binary one by the flip-flop circuit 12.

Figure 2:
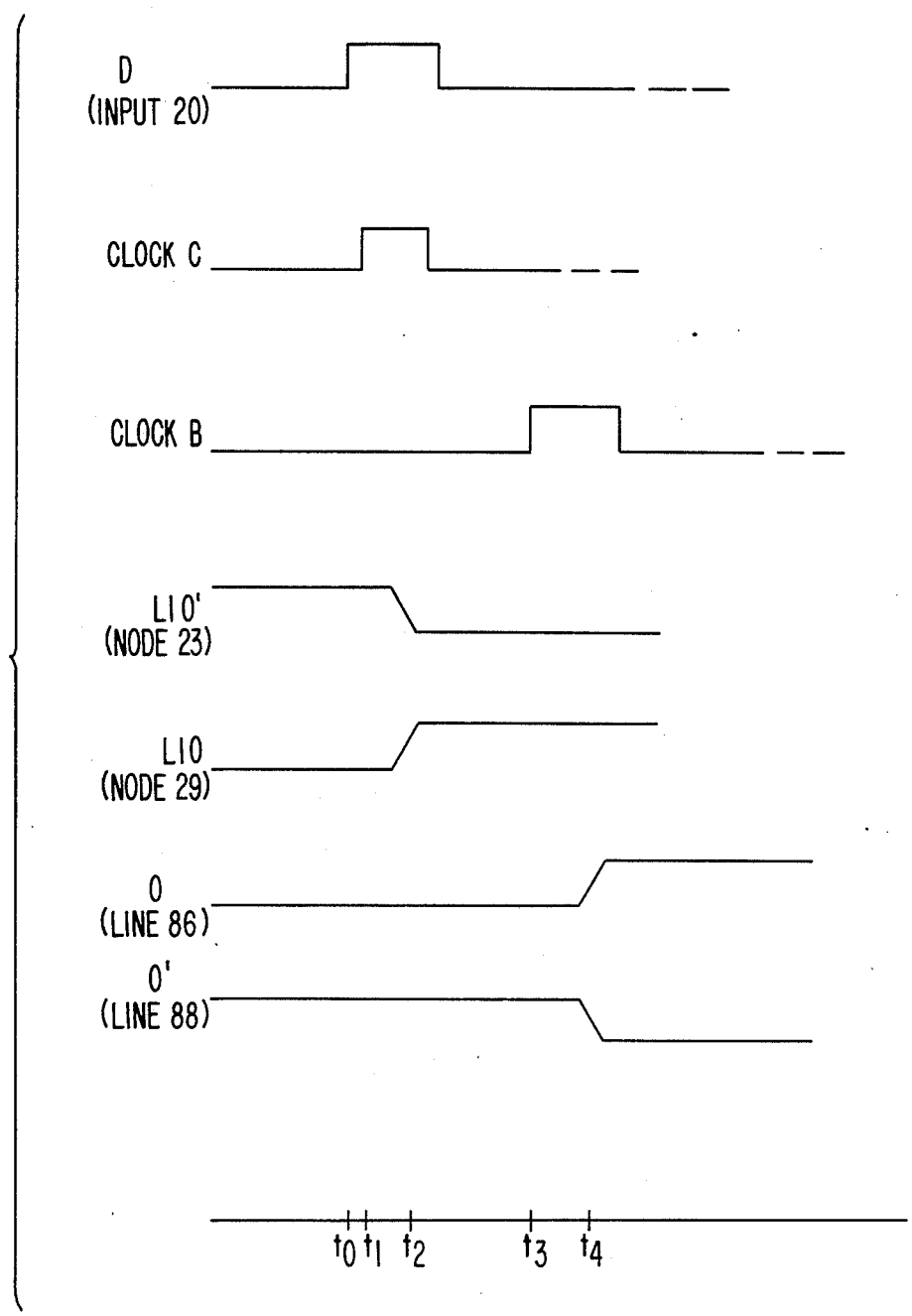
FIG. 2 shows waveform diagrams associated with the latch circuit herein disclosed.

Referring to FIGS. 1 and 2, the latch circuit 10 can be operated in the data mode or in the test mode. In the data mode at time t₀, a data signal D is applied to the data input 20. The data signal D is then inverted by inverter circuits 19 and 25 such that a complement data signal D' appears at the first node 17 and the true data signal D appears at the third node 27. Thereafter at time t₁, a positive clocking potential C, which is applied to gate inputs of the transmission gates 22 and 28, facilitates the application of data signals D and D' to the second node 23 and the fourth node 29, respectively. The gate inputs of the cross-coupled inverter circuits 30 and 32 are coupled to the fourth node 29 and the second node 23, respectively. For purposes of illustration only, let us assume that the data signal D is a binary one or high-level signal. Thus, a binary zero or low-level signal now appears at the second node 23 which turns on FET device 38 and turns off FET device 40 which facilitates the clamping of the positive reference potential or the high-level signal to the fourth node 29 at time t₂. In a similar manner, the inverter circuit 25 applies a binary one signal to the fourth node 29 which turns off FET device 34 and turns on FET device 36 which facilitates the clamping of ground potential or the low-level signal to the second node 23 at time t₂.

At time t₃, a positive clocking potential B is applied to gate inputs of the transmission gates 48 and 58 of the flip-flop 14. Inverter circuits 47 and 57 are coupled to the second node 23 (L1O') and the fourth node 29 (L1O). The low-level signal, which is available on an output L1O', is inverted by circuit 47 and appears as a high-level signal at the sixth node 50. In a similar manner, the high-level signal, which is available on an output L1O is inverted by circuit 57 and appears as a low-level signal at the eight node 60. The high-level signal appearing at the sixth node 50 turns off FET device 70 and turns on FET device 72 thereby clamping the eight node 60 to ground potential. The low-level signal appearing at the eight node 60 turns on FET device 42 and turns off FET device 44 thereby clamping the sixth node 46 to the positive reference potential. Output drivers 74 and 76, which are coupled to nodes 60 and 50, respectively, facilitate the generation of an output signal O and its complement O' on lines 86 and 88, respectively.

In operating the latch 10 in the test mode, a test signal S in the form of a high-level signal appearing on line 90 turns on FET device 80. Thereafter, the FET device is turned on by the application of a high-level clocking potential A to a gate input thereof. The clocking potential A facilitates the application of ground potential through FET device 80 to the second node 23. The ground potential appearing at the second node 23 turns on FET device 38 and turns off FET device 40 thereby clamping the fourth node 29 to the positive potential. The presence of the positive potential at the fourth node 29 then turns off FET device 34 and turns on FET device 36 thereby clamping the second node 23 to ground potential. Thereafter the clocking potential A is removed which turns off FET device 78. The test signal S stored in flip-flop 12 is transferred to the flip-flop 14 by applying the clocking potential B to the gate inputs of the transmission gates 48 and 58. In a similar manner, a complement test signal S' may be stored at the fourth node 29 by applying the clocking potential A to a gate input of the FET device 82. The complement test signal S' is transferred to he flip-flop 14 in the same manner as stated above for the test signal S.

In summary, operating the latch circuit 10 in the data mode, one side of the flip-flops 12 and 14 push the respective nodes up to the positive reference potential while the opposite side of the flip-flops pull the respective nodes down to ground potential thereby increasing the switching speed of the latch. Both flip-flops 12 and 14 operate in a dual side push-pull manner. In operating the latch circuit 10 in the test mode, one side of the flip-flop 12 is pulled down to ground potential which then allows the opposite side, in response thereto, to go the positive reference potential. The presence of the positive reference potential then clamps the one side to ground potential. The flip-flop 12 now operates in a single-side pull down manner while flip-flop 14 operates in the dual side push-pull manner.

Figure 3:
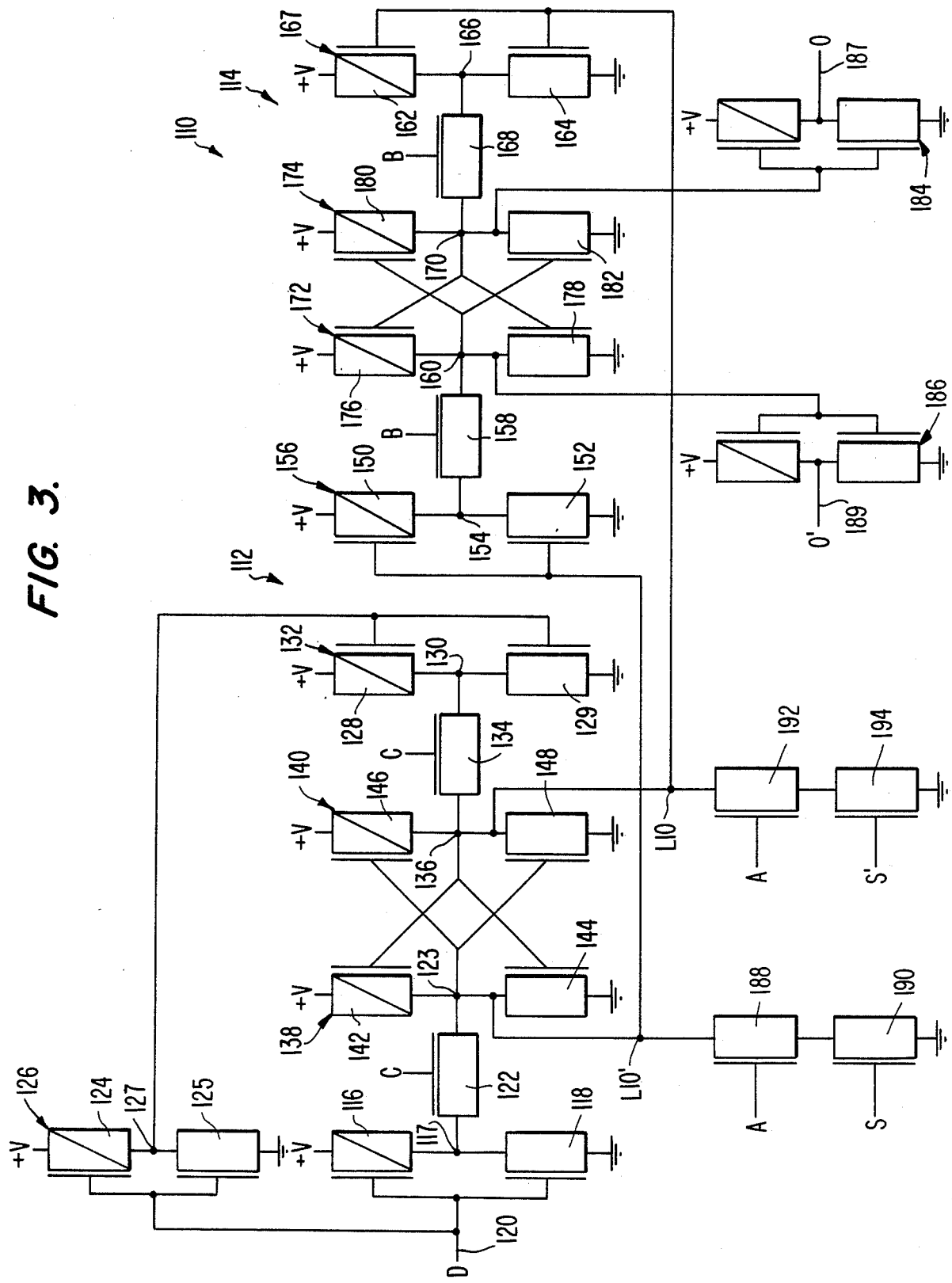
FIG. 3 shows a schematic diagram of an alternate embodiment of the latch circuit in accordance with the principles of the invention.

Referring to FIG. 3, there is shown an alternate embodiment 110 of the dual-input CMOS shift register latch circuit 10. The latch circuit 110 includes two flip-flops circuits 112 and 114 which are concatenated in order to provide the shift register operation of the latch.

Flip-flop circuit 112 includes a first pair of field effect transistor (FET) devices 116 and 118 having their gate inputs coupled to a data input 120. FET device 116 is a P-channel device having its source/drain path connected between a positive reference potential and a first node 117. FET device 118 is a N-channel device having its source/drain connected between the first node 117 and ground potential. FET devices 116 and 118 are coupled together to form a first inverter circuit 119. A first transmission gate 122, which is a N-channel FET device, has its source/drain path coupled between the first node 117 and a second node 123. Flip-flop circuit 112 further includes a second pair of FET devices 124 and 125 having their gate inputs coupled to the data input 120. FET device 124 is a P-channel device having its source/drain path connected between the positive reference potential and a third node 127. FET device 125 is a N-channel device having its source/drain path connected between the third node 127 and ground potential. FET devices 124 and 125 are coupled together to form a second inverter circuit 25. A third pair of FET devices 128 and 129 having their gate inputs coupled to the third node 127, have their source/drain paths coupled between the positive potential and a fourth node 130 and the fourth node and ground potential, respectively. FET devices 128 and 129 form a third inverter circuit 132. A second transmission gate 134, which is a N-channel device, has its source/drain path connected between the fourth node 130 and a fifth node 136.

The flip-flop circuit 112 further includes a bistable circuit having two cross-coupled inverter circuits 138 and 140. Inverter circuit 138 includes a P-channel FET device 142 and a N-channel FET device 144. Inverter 140 includes a P-channel FET device 146 and a N-channel FET device 148. FET devices 142 and 146 have their respective source/drain path connected between the positive reference potential and the second node 123 and the fifth node 136, respectively. FET devices 144 and 148 have their respective source/drain path connected between ground potential and the second node 123 and the fifth node 136, respectively. The gate inputs of FET devices 146 and 148 are coupled to the second node 123 which serves as an output for the flip-flop circuit 112. In a similar manner, the gate inputs of FET devices 142 and 144 are coupled to the fifth node 136 which serves as another output of the flip-flop circuit 112.

Flip-flop circuit 114 includes a first pair of field effect transistor (FET) devices 150 and 152 having their gate inputs coupled to the second node 123. FET device 150 is a P-channel device having its source/drain path connected between a positive reference potential and a sixth node 154. FET device 152 is a N-channel device having its source/drain connected between the sixth node 154 and ground potential. FET devices 150 and 152 are coupled together to form a fourth inverter circuit 156. A first transmission gate 158, which is a N-channel FET device, has its source/drain path coupled between the sixth node 154 and a seventh node 160. Flip-flop circuit 114 further includes a second pair of FET devices 162 and 164 having their gate inputs coupled to the fifth node 136. FET device 162 is a P-channel device having its source/drain path connected between the positive reference potential and a eighth node 166. FET device 164 is a N-channel device having its source/drain path connected between the eighth node 166 and ground potential. FET devices 162 and 164 are coupled together to form a fifth inverter circuit 167. A second transmission gate 168, which is a N-channel device, has its source/drain path connected between the eighth node 166 and a ninth node 170.

The flip-flop circuit 14 further includes a bistable circuit having two cross-coupled inverter circuits 172 and 174. Inverter circuit 172 includes a P-channel FET device 176 and a N-channel FET device 178. Inverter 174 includes a P-channel FET device 180 and a N-channel FET device 182. FET devices 176 and 180 have their respective source/drain path connected between the positive reference potential and the seventh node 160 and the ninth node 170, respectively. FET devices 178 and 182 have their respective source/drain path connected between ground potential and the seventh node 160 and the ninth node 170, respectively. The gate inputs of FET devices 180 and 182 are coupled to the seventh node 160 which serves as an output for the flip-flop circuit 114. In a similar manner, the gate inputs of FET devices 176 and 178 are coupled to the ninth node 170 which serves as another output of the flip-flop circuit 114. Output buffers 184 and 186, which are coupled to the ninth node 170 and the seventh node 160, respectively, facilitate the generation of an output signal O line 187 and its complement O' on line 189, respectively.

The latch circuit 110 also includes four N-channel FET devices 188, 190, 192 and 194 which facilitate the input of test signals into the latch circuit during the test mode of operation. FET devices 188 and 190, having their source/drain paths coupled between the second node 123 and ground potential, facilitate the storage of a binary zero by the filp-flop circuit 112. FET devices 192 and 194, having their source/drain paths coupled between the fifth node 136 and ground potential, facilitate the storage of a binary one by the flip-flop circuit 112. The latch circuit 110 can be operated in the data mode or in the test mode in the same manner as set forth above for the latch circuit 10.

While the invention has been particularly shown and described with reference to a preferred embodiment thereof, it will be understood by those skilled in the art that various changes in detail may be made therein without departing from the spirit, scope and teaching of the invention. Accordingly, the latch circuit herein disclosed is to be considered merely as illustrative, and the invention is to be limited only as specified in the claims.

What is claimed is:

1. An improved, high speed, dual input mode complementary MOS flip-flop storage cell, comprising:
   a bistable circuit;
   a first inverter means, responsive to a true data input signal, for generating complementary data input signals;
   a first transmitting means having a first clocking potential applied thereto during a data input mode interval, for selectively connecting an output of the first inverter means to a first input of the bistable circuit;
   a second inverter means having an input connected to said output of said first inverter means, for generating complementary data input signals;
   a second transmitting means having said first clocking potential applied thereto for selectively connecting an output of second inverter means to a second input of the bistable circuit;

said first and second inverter means respectively applying the complement and the true form of said data input signal to said first and second inputs of said bistable circuit for high speed, dual side/push pull operations during said data input mode interval;

a first testing means coupled to the first input of the bistable circuit for transmitting a true test signal thereto;

a second testing means coupled to the second input of the bistable circuit for transmitting a complementary test input signal thereto;

a test signal gating means having a second clocking signal applied thereto during a test input mode interval, connected between said first testing means and said first input of said bistable circuit, for pull-down test operation;

said test signal gating means connected between said second testing means and said second input of said bistable circuit;

said test input mode interval being nonoverlapping with said data input mode interval;

whereby a dual input mode flip-flop storage cell is formed enabling either a data input signal for said dual side/push-pull data operations or alternately a test input signal for said pull-down test operation to be applied to the first and second inputs of the bistable circuit, thereby changing the binary storage state of the flip-flop storage cell.

2. The storage cell as recited in claim 1 wherein the first input of the bistable circuit is a first node and the second input of the bistable circuit is a second node and wherein the bistable circuit comprises:

a first P channel FET device having its source/drain path connected between a positive reference potential and the first node;

a first N channel FET device having its source/drain path connected between the first node and ground potential;

a second P channel FET device having its source/drain path connected between the reference potential and the second node;

a second N channel FET device having its source/drain path connected between the second node and ground potential; and gates of the first P channel FET device and the first N channel FET device being connected in common to the second node and gates of the second P channel FET device and the second N channel device being connected in common to the first node, forming a bistable circuit.

3. The storage cell as recited in claim 2 wherein the first inverting means comprises:

a third P channel FET device having its source/drain path connected between the positive reference potential and a third note; and a third N channel FET device having its source/drain path connected between the third node and ground potential;

whereby gates of the third P channel device and the third N channel device being connected in common to a fifth node which is a true data input node.

4. The storage cell as recited in claim 3 wherein the second inverting means comprises:

a fourth P channel FET device having its source/drain path connected between the positive reference potential and a fourth node; and a fourth N channel FET device having its source/drain path connected between the fourth node and ground potential;

whereby gates of the fourth P channel device and the fourth N channel device being connected in common to a six node which is a complementary data input node.

5. The storage cell as recited in claim 4 wherein the first transmitting means comprises a fifth FET device having its source/drain path connected between the first node and the third node and its gate connected to the first clocking potential.

6. The storage cell as recited in claim 5 wherein the second transmitting means comprises a sixth FET device having its source/drain path connected between the second node and the fourth node and its gate connected to the first clocking potential.

7. The storage cell as recited in claim 6 wherein said test signal gating means further comprises:

a first means interposed between the first testing means and the first node for selectively coupling the true test input signal to the bistable circuit;

and a second means interposed between the second testing means and the second node for selectively coupling the complementary test input signal to the bistable circuit;

whereby the first clocking potential is applied to inputs of the first and second transmitting means to selectively couple the first and second inverting means to the first and second nodes, respectively, during said data input mode interval and said second clocking potential is applied to inputs of the first and second coupling means to selectively couple the first and second testing means to the first and second nodes, respectively, during said test input mode interval.

8. The storage cell as recited in claim 7 wherein the first testing means comprises a seventh N channel FET device having its source/drain path connected between the first coupling means and ground potential and its gate serving as a true test input node.

9. The storage cell as recited in claim 8 wherein the second testing means comprises an eighth N Channel FET device having its source/drain path connected between the second coupling means and ground potential and its gate serving as a complementary test input node.

10. An improved, high speed shift register latch circuit, comprising:

a first bistable circuit;

a first inverter means, responsive to a true data input signal, for generating complementary data input signals; a first transmitting means having a first clocking potential applied thereto during a data input mode interval, for selectively connecting an output of the first inverter means to a first input of the bistable circuit;

a second inverter means having an input connected to said output of said first inverter means for generating complementary data input signals;

a second transmitting means having said first clocking potential applied thereto for selectively connecting an output of second inverter means to a second input of the bistable circuit;

said first and second inverter means respectively applying the complement and the true form of said data input signal to said first and second inputs of said bistable circuit for high speed, dual side/push pull operations during said data input mode interval; a first testing means coupled to the first input of the bistable circuit for transmitting a true test signal thereto;

a second testing means coupled to the second input of the bistable circuit for transmitting a complementary test input signal thereto;

a test signal gating means having a second clocking signal applied thereto during a test input mode interval, connected between said first testing means and said first input of said bistable circuit, for pull-down test operation;

said test signal gating means connected between said second testing means and said second input of said bistable circuit;

said test input mode interval being nonoverlapping with said data input mode interval;

a second bistable circuit having a third node and a fourth node;

a first data shifting means for coupling said first node of said first bistable circuit and transferring a signal thereat to the third node of the second bistable circuit;

a second data shifting means for coupling said second node of said first bistable circuit and transferring a signal thereat to the fourth node of the second bistable circuit;

a first drive means coupled to the third node for generating a complementary output signal;

a second drive means coupled to the fourth node for generating a true output signal;

whereby a shift register latch is formed enabling either a data input signal for said dual side/push-pull data mode or alternately a test input signal for said pull-down test mode to be applied to the first and second nodes of said first bistable circuit and is transferred to said second bistable circuit.

11. The shift register latch as recited in claim 10 which further comprises:

means interposed between the testing means and the first and second nodes for selectively coupling the true and complementary test input signals to the first bistable circuit; and whereby a first clocking potential is applied to inputs of the transmitting means to selectively couple the first and second generating means to the first and second nodes, respectively, during a data input operation, a second clocking potential is applied to inputs of the coupling means to selectively couple the testing means to the first and second nodes of the first bistable circuit during a test input mode operation and a third clocking potential is applied to inputs of the first coupling means and the second coupling means to selectively shift the binary contents of the first bistable circuit to the second bistable circuit during a shifting operation.

* * * * *